United States Patent [19]

Sherman et al.

[11] 4,441,248

[45] Apr. 10, 1984

[54] ON-LINE INSPECTION METHOD AND SYSTEM FOR BONDS MADE TO ELECTRONIC COMPONENTS

[75] Inventors: Rand C. Sherman, Columbus; Van E. Wood, Delaware, both of Ohio

[73] Assignee: Stanley Electric Company, Ltd., Yokahama, Japan

[21] Appl. No.: 446,174

[22] Filed: Dec. 2, 1982

[51] Int. Cl.³ .............................................. H01L 49/00
[52] U.S. Cl. ...................................... 29/574; 29/584; 228/179
[58] Field of Search ...................... 29/569 L, 574, 584, 29/585, 586, 589; 228/179; 324/71.6, 73 PC, 149, 158 D, 158 T

[56] References Cited

U.S. PATENT DOCUMENTS

| 3,274,667 | 9/1966 | Siebertz | 29/574 |
| 3,634,930 | 1/1972 | Cranston | 29/574 |
| 4,263,547 | 4/1981 | Johnson | 324/149 X |

Primary Examiner—Brian E. Hearn
Assistant Examiner—David A. Hey
Attorney, Agent, or Firm—Robert B. Watkins

[57] ABSTRACT

On-line inspection of electric characteristics of a semiconductor device can be achieved during a step of bonding a lead wire to a chip surface of the semiconductor device in the process of fabricating an electronic component, by the use of a circuit arrangement formed between a lead wire fed from a bonder and connectors serving as electric terminals when the chip is mounted thereon to be made into an electronic component, and by the application of electric power thereto.

9 Claims, 4 Drawing Figures

ON-LINE INSPECTION METHOD AND SYSTEM FOR BONDS MADE TO ELECTRONIC COMPONENTS

BACKGROUND OF THE INVENTION a. Field of the Invention

The present invention relates to an on-line inspection technique for electronic components such as semiconductor devices, and more particularly it pertains to a method of checking electrical characteristics during the fabricating process at the stage that lead wires are bonded to semiconductor devices in order to detect and remove bad components.

b. Description of the Prior Art

Semiconductor devices serving as electronic components which are typically diodes, transistors, SCRs (Silicon Controlled Rectifiers) and ICs are usually completed as electronic components through a series of steps such that a semiconductor chip, which has experienced the fabricating process of "diffusion" to impart a required function thereto, is fixedly mounted by, for example, soldering onto a base or support. The base is called a stem, printed plate or lead frame. Thereafter, connection is established, with a lead wire, between the ohmic contact metal electrode on the semiconductor chip and a predetermined terminal or terminals of equipment by using an apparatus called a wire bonder. Subsequently, the resulting semiconductor device is molded with a plastic material or encapsulated in a metal can. In order to complete the production of the electronic component, there are needed the steps of checking various electrical characteristics required of the component at the end of the above mentioned fabricating process and of sorting out only good components.

The causes for electronic components using semiconductor devices to be classified as rejectable articles may be roughly divided into the following two: the bad condition noted within the semiconductor chip per se, and the poor technique of fabrication in the stage of bonding a lead wire.

The poor electrical characteristics of a semiconductor chip, mentioned above, are often found through a checking made by the use of a testing apparatus, called a prober, of a semiconductor wafer prior to being separated into semiconductor chips by dicing, and bad portions; i.e., bad chips, which have been separated from the wafer are removed. However, there have been cases where the above mentioned check-out or inspecting process is omitted for the sake of simplifying the fabricating process, or from the viewpoints of price, productivity and so forth. In these cases good components are segregated only through a final inspecting process.

The other cause for the development of bad components during the fabrication stages immediately preceding the bonding of lead wires can arise during the dicing and bonding steps, even if the inspecting steps such as check-out and selection of electrical characteristics have already been carried out by probing during the wafer stage. Such defects attributable to the dicing process and the bonding process have been considered in the past to be detectable only during the final inspecting step.

The frequency of the occurrence of bad components during the dicing process or bonding process is not negligible. Those bad conditions of components which occur during the subsequent resin-molding process or metal-can encapsulating process, intended for the completion of components as electronic components, are found mostly during the life test of the components or after the components are placed on the commercial market as goods. These bad conditions are not of such nature that they can be found readily by a final inspection of the conventional type.

The conventional simple inspecting process for finding rejectable conditions which have occurred during the bonding step is an inspection process allowing the molding or encapsulation of not only good components but also rejectable components. It is an inspecting process which will give an adverse effect on price and productivity, as brought about by waste of materials.

SUMMARY OF THE INVENTION

It is, therefore, the object of the present invention to provide an inspection process capable of easily making on-line check-out of electrical characteristics, including the check-out of bad conditions developing during the step of bonding a lead wire to a semiconductor chip, to thereby be able to supply only good components to a subsequent assembly line which include a molding or encapsulating step.

The invention is a method of making on-line inspection of electric characteristics of a semiconductor device during the step of bonding a lead wire to the surface of the chip of said semiconductor device during the process of fabricating an electronic component, comprising: applying an electric power across the lead wire that is bonded to the chip and bonded to connectors which serve as electric terminals when the semiconductor device is assembled into an electric component.

The invention includes a system for making on-line inspection of the electric characteristics of a semiconductor device during the step of bonding a lead wire to a chip surface of the semiconductor device in the process of fabricating an electric component comprising: an electroconductive base means; an electroconductive cathode connector means projecting from one surface of the base means and carrying, at its free end, a reflector means securely receiving a semiconductor chip bearing on its surface an ohmic contact metal electrode; an electroconductive anode connector means projecting from a surface of the base means adjacent to the cathode connector means and forming a pair therewith; a capillary means movably positionable above the cathode connector means and said chip, and positionable over the anode connector means for feeding a lead wire to be bonded to connector means; and an electric circuit means formed between the base means and the lead wire via the capillary means, and connected to a power supply having an on/off switching means for applying and cutting the electric power across the lead wire and the base means.

The foregoing and other advantages of the invention will become apparent from the following disclosure in which a preferred embodiment of the invention is described in detail and illustrated in the accompanying drawings. It is contemplated that variations in structural features and arrangement of parts may appear to the person skilled in the art, without departing from the scope or sacrificing any of the advantages of the invention.

DETAILED DESCRIPTION OF THE PREFERRED EMBODIMENTS

For a better understanding of the present invention, description will first be made of a method of making on-line inspection of the electrical characteristics of a component during the step of bonding a lead wire to a semiconductor chip of a light-emitting diode (LED) made of a Group III-V compound semiconductor material such as GaP or GaAs.

Figure 1:
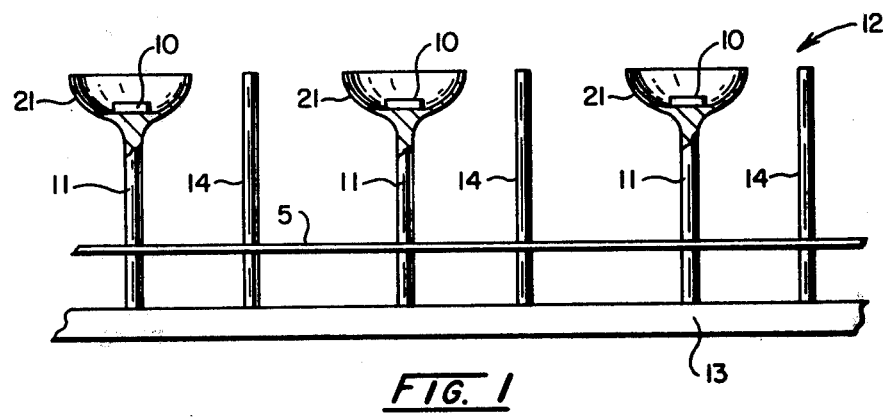
FIG. 1 is a diagrammatic elevation view of a lead frame having a plurality of metal bases or supports for mounting semiconductor devices, such as LEDs.

Referring to FIG. 1, a semiconductor wafer 10 has been diced into individual semiconductor chips by a cutting apparatus called, for example, a scriber. Such chip is fixedly mounted by a technique, such as soldering, onto a metal support 11. Usually, in order to improve the productivity, a lead frame 12 is used which is an integral unit carrying a plurality of supports. FIG. 1 shows an example of such a lead frame structure with LED chips fixedly mounted on the supports 11. On a metal plate 13, the supports 11 also serve as cathode connectors and are paired with anode connectors 14. The supports 11 and anode connectors 14 are made of an electroconductive material such as a metal.

A bar 5 is attached to the support 11 and anode connectors 14 for increasing the mechanical strength of the lead frame. This bar 5 may be omitted or not as required. In some cases, this bar also serves as an anode connector. Each cathode connector 11 has, at its top, a parabolic reflector 21 on which is fixedly mounted a semiconductor chip 10 of an LED.

After each semiconductor chip 10 has been mounted on the lead frame 12 as stated above, a lead wire 7 is bonded to the chip surface by an apparatus called a bonder.

The present invention provides the means for an inspection technique as described below.

Figure 2:
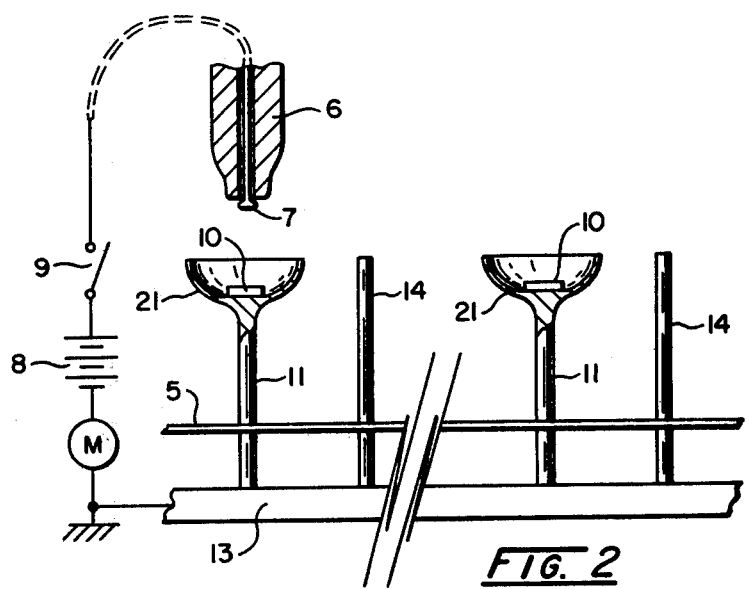
FIG. 2 is a diagrammatic elevation view of an example arrangement of a bonding apparatus designed to apply a voltage across a lead wire and a lead frame.

As shown in FIG. 2, in the inspecting system for use in the present invention, there are provided a power supply 8 and a switch 9 for the application of a voltage across the lead wire 7 which is fed from a capillary 6. The metal plate 13 is electrically conductive to both the cathode connector 11 and the anode connector 14. Measuring and indicating instruments, such as ammeters, voltmeters, or other instrumentation M, may also be attached as necessary. For LEDs and some other devices, observation of the presence or level of light emitted when the power is applied, may constitute the indicating criterion for inspection and acceptance or rejection.

Figures 3A, 3B:
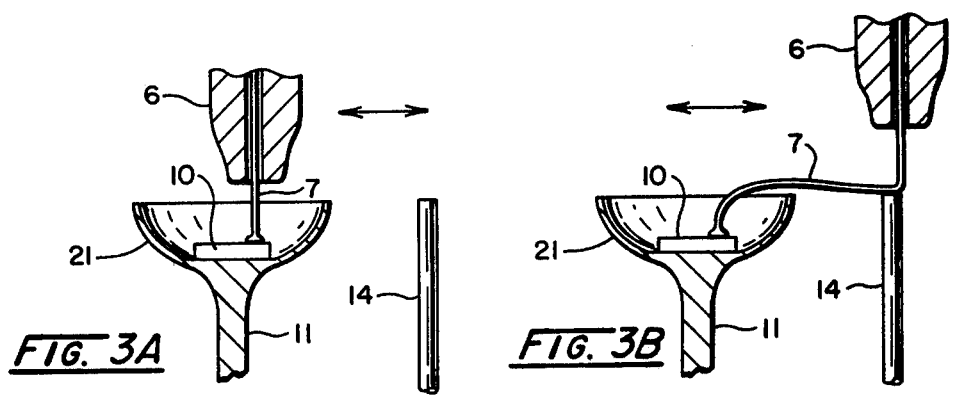
FIG. 3(a) is a schematic illustration of the first state of the connector of a LED device showing how a lead wire is connected between the LED chip and a connector.
FIG. 3(b) shows a succeeding stage of the connection shown in FIG. 3(a).

As shown in FIG. 3(a), in the stage of bonding, for example by ultrasonic thermal compression technique, a lead wire onto an ohmic contact metal electrode which is provided locally on the top surface of a semiconductor chip 1, the electric characteristics such as breakdown voltage, reverse and forward voltage current characteristics and luminescing characteristic of the resulting component are checked out. This is done by using a closed circuit that is formed by closing the switch 9, and by the application of a voltage across the lead wire and the lead frame from the power supply 8. By this means, a bad condition of the semiconductor chip per se; i.e., the bad condition of the chip caused as it is broken during the dicing step, the poor fixing of the chip onto the parabolic reflecting (support) during the mounting step, and the bad bonding of a lead wire on the cathode side during the bonding step, can all be easily detected by the provision of such electric circuit and usual measuring instruments. Since these bad conditions can be detected in the above mentioned stage, any bad semiconductor chips can then be replaced by good ones as required.

Only those chips that have passed this inspection are subjected to the next step of bonding a lead wire to the anode connector 14 as shown in FIG. 3(b). It should be noted here that in this stage the circuit is closed again. Thus, in case the condition of the bond made at the anode connector 14 is good, the circuit will be shorted. In this way, the condition of bonding at the anode connector 14 can be determined. It should be understood that rejectable components may be removed from the lead frame in the stage where the semiconductor devices are bonded with lead wires.

By forming the above mentioned circuit arrangement, and by the application of an electric power to this circuit during the inspecting process, substantially all kinds of bad conditions that have developed during the fabricating process, such as the dicing step and the bonding step, including, of course, the electrical characteristics of the semiconductor chip, can be detected very easily without requiring the addition of other inspecting steps. By the adoption of the process of the present invention it is possible, as required, to omit the step of detecting rejectable semiconductor chips by the use of a prober in the stage of a wafer, and/or the step of marking rejectable chips, and/or final check-out of electric characteristics of the components. Thus, the entire process is simplified and underdesirable wasting of material in the subsequent assembly line can be avoided, and accordingly, a lowering of manufacturing cost can be achieved.

Description of the present invention has been made above in the instance of an LED. It will be appreciated easily by those skilled in the art that the present invention can be applied equally effectively to an array of a plurality of LEDs, or to various other semiconductor devices and equipments. The maximum usefullness can be obtained from the method of the present invention when it is used in inspecting electrical characteristics of semiconductor devices having a simple function such as LEDs having ohmic contact metal electrodes on both the top and bottom surfaces of the semiconductor chip of the diode.

It is herein understood that although the present invention has been specifically disclosed with a preferred embodiment and examples, modifications and variations of the concepts herein disclosed may be resorted to by those skilled in the art. Such modifications and variations are considered to be within the scope of the invention and the appended claims.

What is claimed is:

1. A method of making on-line inspection of electric characteristics of a semiconductor device during a step of bonding a lead wire to a chip surface of said semiconductor device in the process of fabricating an electronic component, comprising:

applying an electric power across said lead wire which is to be bonded to said chip, and bonded to connectors which serve as electric terminals when said semiconductor device is assembled into an electronic component.

2. A method according to claim 1 in which said semiconductor device is a diode.

3. A method according to claim 1 in which said semiconductor device is a light-emitting diode.

4. A method according to claim 1 in which said semiconductor device is provided in plural number on a semiconductor support.

5. A method according to claim 1 in which measurements or observations are made of the amount of the characteristics of the power that has been applied after said lead wire has been bonded to said chip.

6. A system for making on-line inspection of electric characteristics of a semiconductor device during a step of bonding a lead wire to a chip surface of said semiconductor device in the process of fabricating an electronic component, comprising:
 a. an electroconductive base means;
 b. an electroconductive cathode connector means projecting from one surface of said base means and carrying, at its free end, a reflector means securely receiving a semiconductor chip bearing on its surface an ohmic contact metal electrode;
 c. an electroconductive anode connector means projecting from a surface of the base mans adjacent to said cathode connector means and forming a pair therewith;
 d. a capillary means movably positionable above said cathode connector means and said chip and positionable over said anode connector means for feeding a lead wire to be bonded to said connector means; and
 e. an electric circuit means formed between said base means and said lead wire via said capillary means and connected to a power supply and having an on/off switching means for applying and cutting an electric power across said lead wire and said base means.

7. A system according to claim 6 in which said cathode connector means and said anode connector means are connected by a bar.

8. A system according to claim 7 in which said bar is an electroconductive bar and serves as an anode connector means to replace the projecting anode connector means.

9. A system according to claim 6 wherein measuring or observation means is provided in said electric circuit means for determining the characteristics of the power in the circuit.

* * * * *